United States Patent
Caspers et al.

[11] Patent Number: 6,163,229
[45] Date of Patent: *Dec. 19, 2000

[54] FREQUENCY GENERATOR FOR GENERATING TWO INDEPENDENT FSK SIGNALS

[75] Inventors: Alfred Caspers; Manfred Mueller, both of Limburg; Stefan Lichterfeld, Taunusstein; Norbert Roettger, Waldmuehlen, all of Germany

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/988,079

[22] Filed: Dec. 10, 1997

[30] Foreign Application Priority Data

Dec. 17, 1996 [GB] United Kingdom ............... 9626186

[51] Int. Cl.$^7$ .................... H03B 21/01; H03C 3/00; H04L 27/12
[52] U.S. Cl. ................... 332/100; 331/40; 331/41; 332/101; 375/272; 375/306; 375/307
[58] Field of Search .................... 332/100, 101, 332/102; 375/272, 303, 306, 307; 331/37, 40, 41

[56] References Cited

U.S. PATENT DOCUMENTS

| | | | |
|---|---|---|---|
| 4,258,436 | 3/1981 | Campbell | 331/76 |
| 5,309,479 | 5/1994 | Cheah | 375/303 |
| 5,329,258 | 7/1994 | Matsuura | 332/100 |
| 5,446,421 | 8/1995 | Kechkaylo | 332/100 |

*Primary Examiner*—Siegfried H. Grimm
*Attorney, Agent, or Firm*—Frank M. Scutch, III

[57] ABSTRACT

A frequency generating circuit scales a warp range of a frequency signal. The frequency generating circuit includes a first frequency signal (10) having a first offset signal with a first frequency relationship to the first frequency signal, and a second frequency signal (14). A frequency scaling element (16) receives the first frequency signal (10) and second frequency signal and provides a third frequency signal, such that the third frequency signal includes the first offset signal having a second frequency relationship to the third signal. A switch (54), has a control input (74), a first input for receiving the first frequency signal, a second input operably coupled to the frequency scaling element (16, 42) for receiving the third frequency signal and an output (76) operably coupled to the first input or the second input dependent upon a control signal applied to the control input (74).

7 Claims, 4 Drawing Sheets

FREQUENCY GENERATOR FOR GENERATING TWO INDEPENDENT FSK SIGNALS

FIELD OF THE INVENTION

This invention relates to frequency generating technology. The invention is applicable to, but not limited to, frequency modulation (FM) radio generation, and in particular the control of signal frequency shifts in FM circuits.

BACKGROUND OF THE INVENTION

A number of radio systems use transmission of frequency modulation signals to communicate across a broad range of radio frequencies. A majority of the frequency modulation generation circuits, for example modulator circuits, exciter circuits, used in such radio systems are alternating current (AC)-coupled. A preferred arrangement for generating frequency modulation signals is to use a two port modulation technique, whereby synthesisers and VCOs in such circuits are fed with two signals. The first, a VCO modulation input signal (vco_mod), modulates the higher frequencies and a second, a compensation input port signal modulates the lower frequencies close to DC (ref_mod). A benefit of using such a two-port modulation technique is that the modulation frequencies can be generated much more accurately down to fractions of a Hertz.

For the frequency generation circuit to also transmit data transmissions, such as telegrams for the European Paging standard (POCSAG), where the modulation scheme is Direct Frequency Shift Keying (DFSK), such a DFSK modulation technique is not capable of producing the required frequency deviation of the carrier signal. A DFSK frequency generation circuit requires a direct current (DC) signal FM response for the synthesiser's reference frequency in addition to the VCO-port modulation, in generating a final frequency. For this reason a reference oscillator with a DC response warp input is required. To provide a well balanced modulation signal (ref_mod and vco_mod) which shows a real DC response FM, a sufficiently large warp range, for example +/−40 parts per million (ppm) is needed. However, typical reference oscillators have a limited warp range of say, +/−10 ppm. Hence, this warp, used for generating standard frequency modulation signals, is not sufficient to also create a DC response output deviation required for DFSK generation. Dividing down or multiplying up the reference oscillator frequency will not affect the ppm warp range. The ppm ratio is therefore fixed.

A further problem occurs in the case where longer data telegrams are transmitted with, for example, a "worst case" series of bit patterns—successively weighted either to "1" or weighted to "0", thereby providing a one-sided modulation deviation causing the carrier frequency to drift towards one of the adjacent channels. This is due to the fact that such circuits are alternating current (AC)-coupled.

Thus there is a requirement to provide a frequency generation circuit to facilitate such modulation schemes and/or data transmissions of this type. Furthermore, there is a requirement to provide a frequency generation circuit that is capable of operation with both current frequency modulation transmissions and additional/enhanced transmissions by for example scaling warp input ppm values, such as those described hereinbefore.

SUMMARY OF THE INVENTION

In a first aspect of the present invention, a frequency generating circuit is provided. The frequency generating circuit includes a first frequency signal with a first offset signal having a first frequency relationship to the first frequency signal, and a second frequency signal. A frequency scaling element receives the first frequency signal and second frequency signal and provides a third frequency signal, such that the third frequency signal includes the first offset signal having a second frequency relationship to the third signal. A switch has a control input, a first input for receiving the first frequency signal, a second input operably coupled to the frequency scaling element for receiving the third frequency signal and an output operably coupled to the first input or the second input dependent upon a control signal applied to the control input.

In this manner, a fixed warp range (ppm value) of an input signal, providing a specific frequency shift to frequency modulate a carrier signal, is scaled. The resultant output signal provides an alternative warp range value, and hence frequency shift, to modulate the final carrier frequency. This enables two separate frequency modulation signals, having different frequency shifts, to be alternately transmitted.

In a second aspect of the present invention, a radio unit having a frequency generating circuit for scaling offset signals is provided. The radio unit is capable of transmitting at least two independent frequency shift keyed signals.

Preferably the at least two independent frequency shift keyed signals include a mobile radio signal in a first mode of operation and a paging signal in a second mode of operation.

In this manner, a radio unit can alternately switch between transmission of mobile radio frequency shift keyed signals and paging frequency shift keyed signals.

In a third aspect of the present invention a method for scaling an offset frequency of a signal frequency is provided. The method includes the steps of mixing the signal frequency having the offset frequency with a multiplied reference frequency to provide a difference signal and dividing the difference signal by a second signal to provide an output frequency having a scaled offset frequency. Preferably, the second signal is a non-multiplied reference frequency.

In this manner, two separate frequency modulation signals, having different frequency shifts, can be alternately generated and transmitted.

A preferred embodiment of the invention will now be described, by way of example only, with reference to the drawings.

DETAILED DESCRIPTION OF THE DRAWINGS

Figure 1:
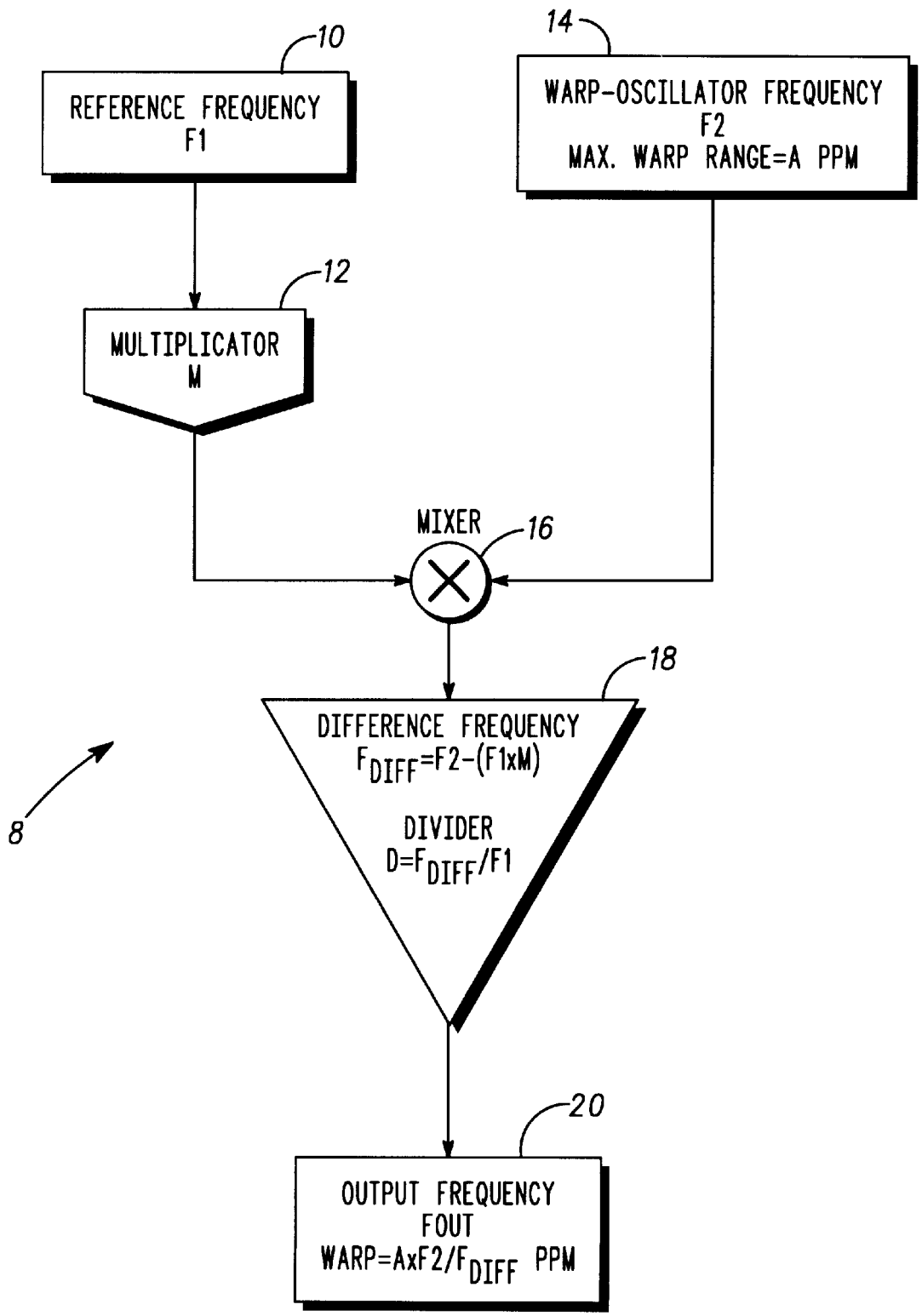
FIG. 1 is a conceptual block diagram of a frequency generating circuit according to a preferred embodiment of the invention.

Referring first to FIG. 1, a conceptual block diagram of a frequency generating circuit according to a preferred embodiment of the invention, is shown. The frequency generating circuit 8 includes a first frequency source, for example reference frequency 10, providing a first frequency F1 to multiplier 'M' 12. A multiplied first frequency (M*F1) is provided to a frequency scaling element, preferably a mixer 16, where it is mixed with an output from a second frequency source, for example a warp-oscillator second frequency F2 14, having a maximum warp-range of 'A' ppm. The mixer 16 provides a number of frequency signal outputs, one of which is the difference (third) frequency signal between the two input signals, namely:

$$F_{diff} = F2 - (F1*M). \quad (1)$$

The mixer output is input to a divider 18 where the difference frequency is divided by the reference frequency F1. The divider 18 provides an output signal $F_{out}$ such that the warp of Fout corresponds to:

$$\text{Warp } (F_{out}) = A*F2/(F_{diff}) \text{ in ppm.} \quad (2)$$

In operation, the multiplied reference frequency and the warp-oscillator frequency F2 14, having a maximum warp-range of 'A' ppm, are input to the mixer 16 where the signals are mixed. The resultant output from the mixer 16 is fed into a divider 18 to provide an output $F_{out}$ of ($F_{diff}$/F1) (the dividing ratio). $F_{out}$ therefore includes a scaled warp range of $A*F2/(F_{diff})$ in ppm. In this manner, an input signal, in this case the warp-oscillator frequency F2 14, has a fixed ppm value (warp range) which is scaled, thereby providing an alternative frequency shift option of the final carrier frequency. The final carrier frequency can then be modulated with either the frequency shift range provided by the warp range 'A' or the warp range $A*F2/(F_{diff})$. This enables two separate frequency modulation signals, having different frequency shifts, to be alternately transmitted.

Figure 2:
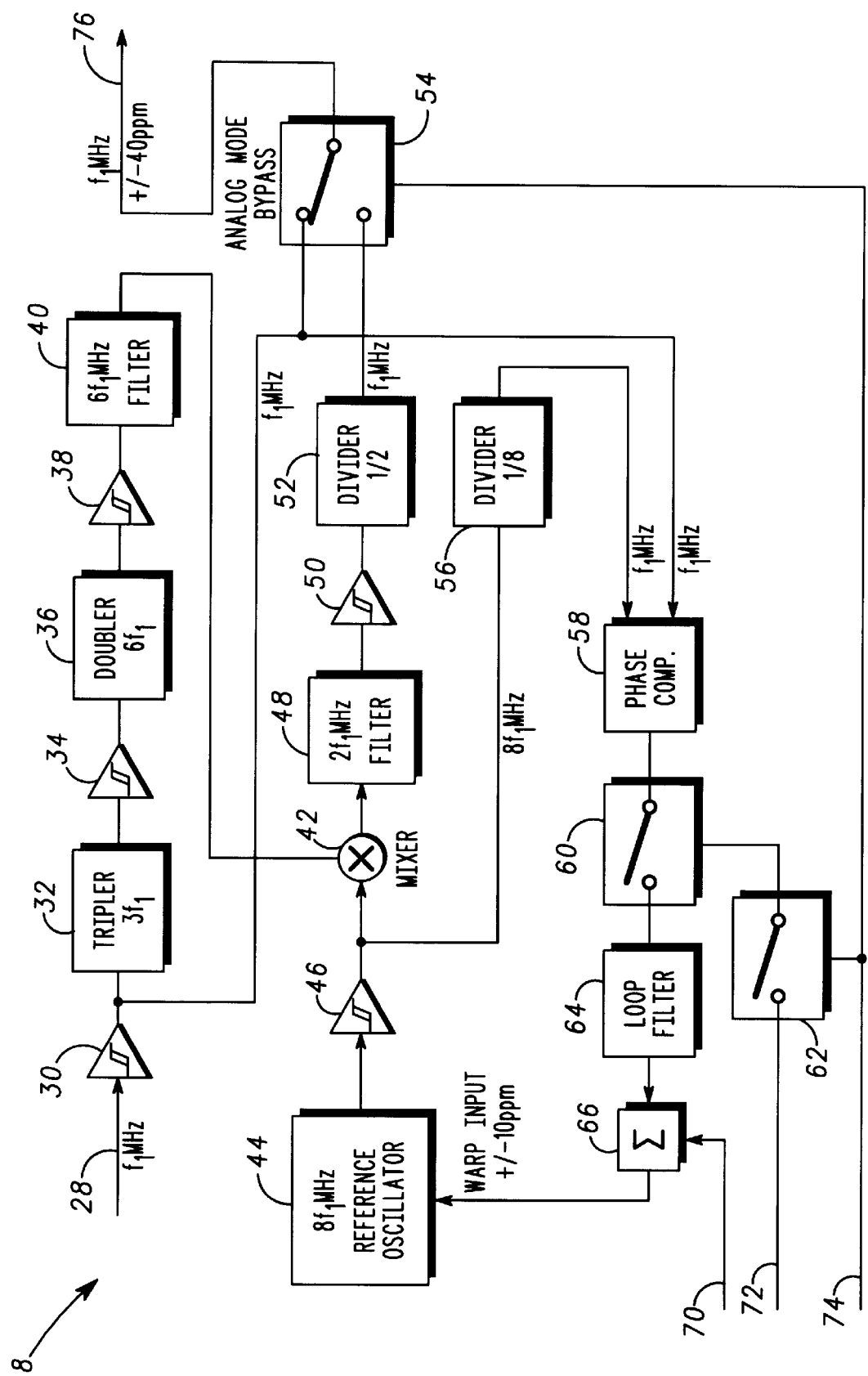
FIG. 2 is a block diagram of a frequency generating circuit, according to the preferred embodiment of the invention.

Referring now to FIG. 2, a block diagram for a frequency generating circuit according to the preferred embodiment of the invention is shown. The frequency generating circuit 8 includes a reference frequency 28 providing a frequency F1 to a trippler 32 via a schmitt trigger 30. The trippler 32 provides a frequency of three times F1 to a doubler 36 via a schmitt trigger 34. The doubler 36 provides a frequency output of 6 times F1 to a filter 40 via a schmitt trigger 38. The output from the filter 40 is fed into a mixer 42.

A reference oscillator 44 provides a second reference frequency 8 times F1 to a schmitt trigger 46. The reference oscillator 44 receives a warp input from a summer 66. The summer 66 receives a reference modulation signal 70 and a phase comparator signal via the phase comparator 58 switch 60 and loop filter 64. The switch 60 receives a control signal via a switch 62. The switch 62 is controlled by a second control signal 74.

Preferably a processor (not shown) provides the reference modulation signal 70 and control input signals 72 and 74. The reference oscillator 44 and schmitt trigger 46 provide an input signal to a divider 56 where the reference oscillator signal is divided by a factor eight in the preferred embodiment of the invention. The divider 56 therefore provides an F1 input to the phase comparator 58. The phase comparator 58 compares the output from the divider 56 with the reference frequency F1 provided from the schmitt trigger 30. When switch 60 is activated to pass the output of the phase comparator 58 to the loop filter 64 the phase comparison signal output from phase comparator 58 is added to the reference modulation signal 70 in the summer 66. This provides a warp input to the reference oscillator 44.

The reference oscillator signal provided from the reference oscillator 44 and the schmitt trigger 46 is input to the mixer 42 where it is mixed with the signal output from the filter 40. The output from the mixer is fed into a filter 48, a schmitt trigger 50 and then a divider 52 where it is fed into a further switch 54. The reference frequency F1 output by schmitt trigger 30 is also fed into switch 54. Switch 54 is controlled via control signal 74. In this manner, control signal 74, controls operation of the switch 54 and switch 62 to enable either the reference frequency F1 fed from the output of the schmitt trigger 30 or the reference oscillator frequency mixed with F1 and fed into the divider 52, to be provided as the output from the frequency generating circuit.

In operation reference oscillator 44, schmitt trigger 46, divider 56, phase comparator 58, switch 60, loop filter 64 and summer 66 comprise a phase locked loop. The reference modulation signal 70, provides a warp input value of for example, +/−10 ppm to the reference oscillator 44. When the reference oscillator 44, with a warp input provided by the reference modulation signal 70, is fed into the mixer 42 and mixed with the output of the filter 40 i.e. the multiplied reference frequency F1, an output is provided to the filter 48 and divider 52 that includes a multiplicative effect on the warp input.

In such a manner, the warp input has been scaled by the frequency difference provided to the input ports of the mixer 42. Thus, the combination of mixing particular frequencies and modulating the transmitter with digital signals provides the result of a real DC response carrier shift. Hence, in the preferred embodiment of the invention, a DC-response capable of POCSAG transmissions can be alternated with standard baseband signals to alternately frequency modulate a carrier frequency in accordance with the desired signal to be transmitted.

In the preferred embodiment of the invention, the particular multiplying, dividing and mixing operations result in a scaling of the frequency shift from +/−10 ppm to 40 ppm, thereby ensuring that the desired deviation of the carrier signal is now no longer a problem.

This very low cost combination of RF and DC response modulation is a completely new procedure for digital POCSAG modulated transmitters. Such an arrangement, combined with a simple phase locked loop (PLL) circuit, provides a capability for high stability simulcast applications of two different frequency modulated signals. In this way, a radio unit containing such a frequency generation circuit has the capability of alternately transmitting two different frequency shift keyed signals, for example a paging frequency shift keyed in accordance with the POCSAG standard and a mobile radio frequency shift keyed signal.

In certain frequency converting applications, frequencies being mixed have an integer relationship with each other. After the mixing operation, the multiplied frequency (for transmit operations) or the difference frequency (for receive operations) is the signal of interest. In the receiver operation the difference signal is known as the intermediate frequency (IF), which can usually be filtered out from the unwanted spurious signals generated in the mixer. Furthermore, when the relationship is an exact integer relationship, there is no distortion of the IF signal. However, when there is not an exact integer, distortion occurs. When using an analog multiplier as the mixer, for example a transistor, such distortion degrades the mixer's IF performance.

Figure 3:
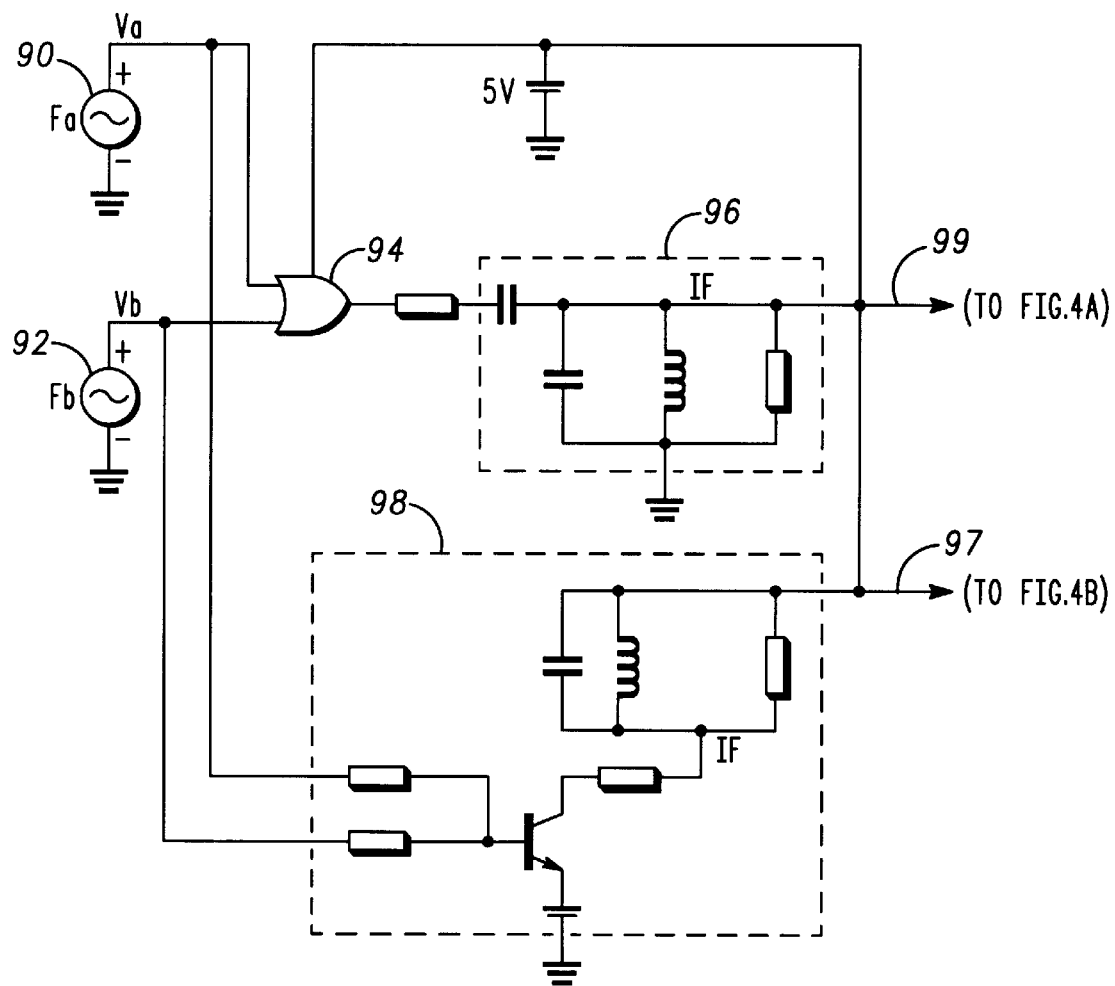
FIG. 3 is a schematic diagram showing a mixer circuit according to the preferred embodiment of the invention.

In the preferred embodiment of the invention, the mixer 16 is a logic gate, as shown in the upper portion of FIG. 3 (providing an output 99 shown in FIG. 4A), and there is a substantially equal relationship between the input first and second frequency signals. An alternative prior art transistor mixer is shown in the lower upper portion of FIG. 3 (providing an output 97 shown in FIG. 4B).

The mixers of FIG. 3 include a frequency, a first source 90 input into an "OR" gate 94. A second source 92 is also fed into "OR" gate 94. For comparison purposes, the first source 90 and second source 92 are also fed into the alternative prior art transistor mixer block 98, the output 97 of which provides the IF response shown in FIG. 4B. The output of the "OR" gate 94 is fed into a matching block 96, the output 99 of which provides the IF response shown in FIG. 4A.

Figure 4A:
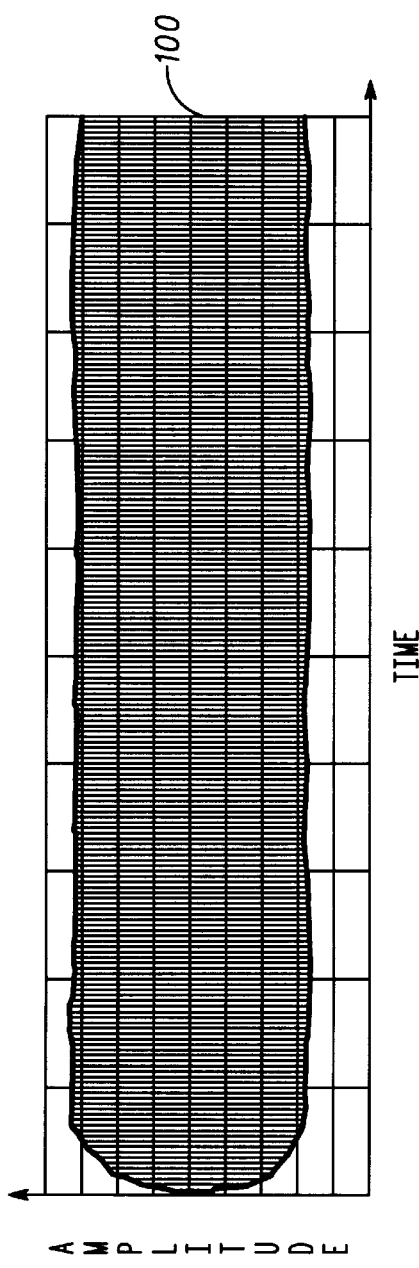
FIG. 4A is a graph showing an improved transient response of a modulated signal according to the preferred embodiment of the invention.
Figure 4B:
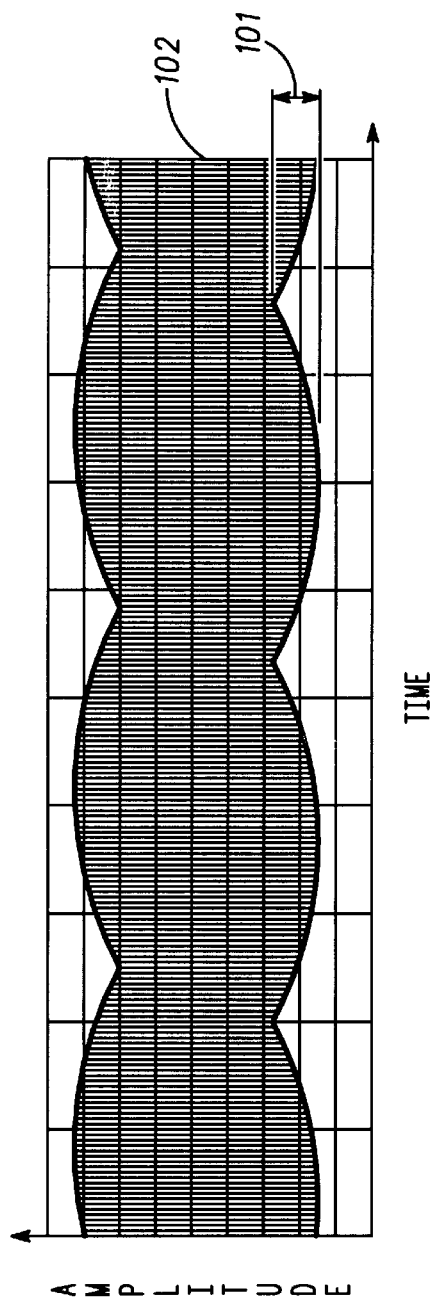
FIG. 4B is a graph showing an improved transient response of a modulated signal according to the preferred embodiment of the invention.

In operation a suitable digital "OR" gate 94 or, for example, "EXOR" gate being used as a mixer, significantly reduces any degradation in mixer IF performance when compared with the prior art transistor mixer block 98, as clearly shown in FIGS. 4A and 4B.

FIGS. 4A and 4B show two graphs of mixer performance. As RF carriers Va, Vb are based on multiples of the reference frequency F1, and as there will typically be a small offset between the fractions, an unwanted low frequency interference will modulate the IF The first graph 100 (FIG. 4A) shows the performance of an OR gate operating as a mixer. The second graph 102 (FIG. 4B) shows the performance of a transistor operating as a mixer.

As is shown in graph 102 of FIG. 4B, the transistor mixer IF is distorted (highlighted at point 101) by approximately 30% amplitude modulation, due to insufficient rejection of low frequency interference, whereas the OR gate mixer IF is significantly cleaner having less distortion due to reduced amplitude modulation effects. The use of suitable digital logic gates for such special frequency mixer applications provides a low cost and efficient design to produce the desired effect.

Thus a frequency generation circuit is provided that allows a number of frequency shifted modulation schemes and/or data transmissions to be used.

We claim:

1. A frequency generating circuit comprising:

a first frequency signal having a first offset signal with a first frequency relationship to the first frequency signal;

a second modulated frequency signal;

a frequency scaling element for receiving the first frequency signal having a first offset signal and second modulated frequency signal, the frequency scaling element having an output of a third frequency signal that consequently includes the first offset signal having a relationship to the third signal different to the relationship with said first frequency signal; and a switch having a control input, a first input for receiving the first frequency signal, a second input operably coupled to the frequency scaling element for receiving the third frequency signal, and an output operably coupled to the first input or the second input dependent upon a control signal applied to the control input.

2. A frequency generating circuit according to claim 1, the frequency generating circuit further comprising:

a first frequency source for providing a first frequency signal;

a multiplier operably coupled to the first frequency source for receiving the first frequency signal and for providing a multiplied first frequency signal to the frequency scaling element; and a second frequency source for providing the second frequency signal.

3. A frequency generating circuit according to claim 1, the frequency generating circuit further comprising:

a divider operably coupled to an input of the switch and an output of the frequency scaling element for dividing the frequency of the third signal to a value substantially equal to the second frequency signal.

4. A frequency generating circuit according to claim 1, wherein the frequency scaling element is an EXOR logic gate.

5. A frequency generating circuit according to claim 1, wherein the frequency scaling element is an OR logic gate.

6. A frequency generating circuit according to claim 1, wherein the frequency scaling element is used for generating the third frequency signal when the first and second frequency signals have a substantially equal integer relationship therebetween.

7. A frequency generating circuit according to claim 1, wherein the frequency generating circuit is used to generate transmit signals, the frequency generating circuit further comprising:

a processor operably coupled to the switch for providing the control input thereby determining transmission of the first frequency signal in a first mode of operation or the third frequency signal in a second mode of operation.

* * * * *